United States Patent [19]

Ozawa

[11] Patent Number: 5,361,225
[45] Date of Patent: Nov. 1, 1994

[54] NONVOLATILE MEMORY DEVICE UTILIZING FIELD EFFECT TRANSISTOR HAVING FERROELECTRIC GATE FILM

[75] Inventor: Takanori Ozawa, Ukyo, Japan

[73] Assignee: Rohm Co., Ltd., Kyoto, Japan

[21] Appl. No.: 34,699

[22] Filed: Mar. 19, 1993

[30] Foreign Application Priority Data

Mar. 23, 1992 [JP] Japan .................................... 4-65245

[51] Int. Cl.⁵ ............................................. G11C 11/22
[52] U.S. Cl. ...................................... 365/145; 365/175
[58] Field of Search ............... 365/145, 175, 147, 117, 365/109, 174, 184, 65

[56] References Cited

U.S. PATENT DOCUMENTS

| | | | |
|---|---|---|---|
| 3,832,700 | 8/1974 | Wu et al. | 365/145 |
| 4,376,984 | 3/1983 | Fukushima et al. | 365/174 |
| 4,431,305 | 2/1984 | Malaviya | 365/174 |
| 4,893,282 | 1/1990 | Eaton, Jr. et al. | 365/145 |
| 5,032,891 | 7/1991 | Takagi et al. | 365/175 |
| 5,198,994 | 3/1993 | Natori | 365/145 |

FOREIGN PATENT DOCUMENTS 277395 11/1989 Japan ........................... G11C 11/40
263386 10/1990 Japan ........................... G11C 11/22

OTHER PUBLICATIONS

Nikkei Microdevices, Jan. 1992, p. 84, English translation of summary attached.

Primary Examiner—Eugene R. LaRoche
Assistant Examiner—Vu Le
Attorney, Agent, or Firm—Steven M. Rabin

[57] ABSTRACT

A nonvolatile memory device having a field effect transistor for storing, which includes source and drain regions in a semiconductor substrate with a channel region interposed between them and a gate electrode above the channel region with a ferroelectric gate film sandwiched between them. Barrier metal is formed in contact with the source region of the field effect transistor for storing to make a Schottky diode in serial connection with the field effect transistor for storing. In reading information, voltage is applied to a serial circuit consisting of the field effect transistor for storing and the Schottky diode to turn the Schottky diode on.

10 Claims, 12 Drawing Sheets

NONVOLATILE MEMORY DEVICE UTILIZING FIELD EFFECT TRANSISTOR HAVING FERROELECTRIC GATE FILM

BACKGROUND OF THE INVENTION

1. Field of the Invention

The present invention relates to a nonvolatile memory device which utilizes a residual polarization in ferroelectrics to store information in a nonvolatile manner and to a method of manufacturing such a nonvolatile memory device.

2. Description of the Related Art

It has been proposed that an MFSFET (Metal Ferroelectric Semiconductor Field Effect Transistor) which is a kind of a field effect transistor having a ferroelectric gate film should be used in designing and fabricating a nonvolatile memory device.

FIG. 4 is a sectional view illustrating a configuration of an MFSFET used for storing information "1" or "0". Close to a surface of a P-type semiconductor substrate 1, an N+-type drain region 3 and an N+-type source region 4 are formed at a certain interval. A region between the drain region 3 and the source region 4 is to act as a channel region 2. On the channel region 2, a gate electrode 6 is provided with a ferroelectric gate film 5 sandwiched between them.

FIG. 5 is a graph illustrating a hysteresis loop of a polarization P in ferroelectrics related to an electric field E. In FIG. 5, a vertical axis represents the polarization P while a horizontal axis represents the electric field E. With reference to the P-E hysteresis loop, the theory of writing, erasing or reading information in or from the MFSFET in FIG. 4 will be described.

In writing information "1" in the MFSFET, ground potential is applied to the substrate 1, and programming voltage sufficiently larger than coercive voltage to the gate electrode 6. "Coercive voltage" means a voltage to obtain a coercive electric field Ec required to remove a residual polarization from the ferroelectrics. In this situation, the ferroelectric gate film 5 is polarized along an electric field applied between the gate electrode 6 and the substrate 1, assuming a state at point P1 in FIG. 5. This causes electrons to be induced to and around a surface of the channel region 2, and consequently, a channel electrically connecting the drain region 3 and the source region 4 is formed. After that, when the programming voltage is removed, the polarization in the ferroelectric gate film 5 exhibits a state at point Q1 in FIG. 5; that is, the polarization stays almost unchanged with the channel left as it was. This is a condition where the information "1" is stored in the MFSFET.

In erasing the information "1" from the MFSFET, or otherwise storing the information "0" therein, contrary to the writing, the ground potential is applied to the substrate 1 while the negative programming voltage sufficiently larger in absolute value than the coercive voltage to the gate electrode 6. At this time, an electric field almost a reversal to that which is applied in the writing, is applied to the ferroelectric gate film 5. This application of the electric field causes the polarization in the ferroelectric gate film 5 to invert into a state at point R1. After that, when the programming voltage is eliminated, the polarization in the ferroelectric gate film 5 varies into a state at point S1; that is, the previous state of the polarization is retained almost unchanged. This causes holes to be induced in the surface of the channel region 2, and therefore, the drain region 3 and the source region 4 stay electrically disconnected. This is a condition where the information "0" is stored in the MFSFET.

The information stored in the MFSFET can be read by examining whether the drain region 3 and the source region 4 are electrically connected or disconnected. For example, current is first supplied to the source region 4, and thereafter, by examining if this current can be detected in the drain region 3, the information stored can be identified with "1" or "0".

FIG. 6A is a circuit diagram showing a circuit structure of a nonvolatile memory where the MFSFET is utilized. The nonvolatile memory includes a memory cell array A where memory cells MC(m, n−1), MC(m, n), MC(m, n+1), MC(m+1, n−1), MC(m+1, n), MC(m+1, n+1) and so forth, are arranged in a matrix manner on a semiconductor substrate, and each cell can store binary data. Each of the memory cells MC(m, n−1), MC(m, n), MC(m, n+1), MC(m+1, n−1), MC(m+1, n), MC(m+1, n+1) and so forth, is formed of a couple of FETs, namely, one of information storing MFSFETs 10(m, n−1), 10(m, n), 10(m, n+1), 10(m+1, n−1), 10(m+1, n), 10(m+1, n+1) and so forth, mated with a corresponding one of MOSFETs (Metal Oxide Semiconductor Field Effect Transistors) 11(m, n−1), 11(m, n), 11(m, n+1), 11(m+1, n−1), 11(m+1, n), 11(m+1, n+1) and so forth. Hereinafter, the memory cells MC(m, n−1), MC(m, n), MC(m, n+1), MC(m+1, n−1), MC(m+1, n), MC(m+1, n+1) and so forth, are referred to as "memory cell(s) MC" en bloc, the MFSFETs 10(m, n−1), 10(m, n), 10(m, n+1), 10(m+1, n−1), 10(m+1, n), 10(m+1, n+1) and so forth, are referred to as "MFSFET(s) 10" en bloc, and MOSFETs 11(m, n−1), 11(m, n), 11(m, n+1), 11(m+1, n−1), 11(m+1, n), 11(m+1, n+1) and so forth, are referred to as "MOSFET(s) 11" en bloc.

Each MFSFET 10 has its drain connected to a source of the corresponding MOSFET 11. Rows of the MFSFETs 10 have their respective gates connected to a row decoder 12 via common word lines WLn−1, WLn, WLn+1 and so forth. Rows of the MOSFETs 11 have their respective gates connected to common selection control lines SLn−1, SLn, SLn+1 and so forth. Furthermore, Columns of the MOSFETs 11 have their respective drains connected to a column decoder 13 via common data lines DLm−1, DLm, DLm+1 and so forth. Reference numeral 14 designates a sense amplifier.

Referring to FIG. 6A, the writing of information in the memory cell MC(m, n) alone will now be described.

In order to write information merely in the memory cell MC(m, n), it is necessary to apply programming voltage $V_{pp}$ sufficiently larger than the coercive voltage only between the gate and drain of the MFSFET 10(m, n). For that purpose, the programming voltage $V_{pp}$ is applied to the word line WLn alone by the row decoder 12, voltage $V_{dd}$ at a fixed level which allows the MOSFETs 11 to turn on is applied to the selection control line SLn alone, and the ground potential equivalent to a potential of the semiconductor substrate is applied to the data line DLm. Programming inhibiting voltage Vi ($\approx V_{pp}/2$) is applied to all the data lines DLm−1, DLm+1 and so forth, but the data line DLm. This causes the ferroelectric gate film in the MFSFET 10(m, n) to be polarized in a direction from a gate electrode towards the semiconductor substrate. In this way, the information "1" is written in the memory cell MC(m, n).

Then, the erasing of the information "1" alone from the memory cell MC(m, n), or the storing of the information "0" therein will be described with reference to FIG. 6B. An arrangement of a memory cell array A and other components shown in FIG. 6B is similar to that of FIG. 6A.

In order to erase only the information "1" from the memory cell MC(m, n), voltage reverse to that used in writing must be applied only between the gate and drain of the MFSFET 10(m, n). For that purpose, the programming voltage $V_{pp}$ is applied only to the data line DLm, and the voltage $V_{dd}$ is applied only to the selection control line SLn. Then, ground potential equivalent to that at the substrate is applied to all the word lines WLn−1, WLn, WLn+1, and so forth. This causes a direction of the polarization in the ferroelectric gate film to be inverted. In this way, the information stored in the memory cell MC(m, n) is loaded with "0" instead of "1", and thus, the erasing of the information "1" is effected.

Next, the reading of merely the information stored in the memory cell MC(m, n) will be explained with reference to FIG. 6C. An arrangement of a memory cell array A and other components shown in FIG. 6C is similar to that of FIG. 6A.

In reading merely the information stored in the memory cell MC(m, n), voltage at a fixed level is applied between the source and drain of the MFSFET 10(m, n). In this situation, examining if current flows between the source and drain, or if a channel is formed, the information "1" or "0" can be identified in reading.

More specifically, the voltage $V_{dd}$ is applied only to the selection control line SLn, and the voltage $V_{dd}$ is applied via a resistance 15 to the data lines DLm−1, DLm, DLm+1, and so forth. The ground potential is applied to the source of the MFSFET 10(m, n). Accordingly, the MOSFET 11(m, n) turns on, and there lies a potential difference of $V_{dd}$ between the source and drain of the MFSFET 10(m, n). If the memory cell MC(m, n) is loaded with the information "1", a channel is formed between the source and drain of the MFSFET 10(m, n). This allows current to flow from the data line DLm into the MOSFET 11(m, n) and the MFSFET 10(m, n). This current causes voltage drop in the resistance 15, and accordingly, a potential at the data line DLm drops to the level of the ground potential.

If the memory cell MC(m, n) is loaded with the information "0", no channel extends between the source and drain in the MFSFET 10(m, n). In this situation, no current flows into the data line DLm, and no voltage drop arises in the resistance 15. Thus, the potential at the data line DLm is retained at the level of $V_{dd}$.

The column decoder 13 applies only the potential at the data line DLm to the sense amplifier 14, which, in turn, amplifies the potential at the data line DLm, and detects the resultant potential. In this way, the reading of data stored in the memory cell MC(m, n) is effected.

If the column decoder 13 selects any data line one after another, data can be sequentially read from the memory cells MC(m, n), MC(m+1, n) and so forth arranged in a row. Moreover, if a sense amplifier is provided for each of the data lines, data can be read at one time in parallel from all memory cells MC(m, n), MC(m+1, n) and so forth arranged in a row.

In recent years, as the semiconductor industry has increasingly advanced, demand for enhanced integration of a nonvolatile memory is raised. As a reaction to this, there may be proposed an enhancement of integration of a memory cell array. As to the memory cell array as shown in FIGS. 6A to 6C, however, it contains two transistors per cell, and such a memory cell array is not suitable for enhancement of the integration.

Then proposed is a memory integrated circuit having a configuration where a single cell has a single transistor, as shown in FIG. 7. In such a memory cell array, memory cells A, B, C, D and so forth, arranged in a matrix manner include respective MFSFETs 20A, 20B, 20C, 20D and so forth. The MFSFETs 20A, 20B, 20C, 20D and so forth, have their respective gates connected to word lines 21A, 21B and so forth, respectively, their respective sources connected to data lines 22A, 22B and so forth, respectively, and their respective drains connected to drain lines 23A, 23B and so forth, respectively.

When information stored in the memory cell A is read, for example, ground potential is applied to all the word lines 21A, 21B and so forth, and current is supplied only to the data line 22A. Furthermore, the ground potential is applied to the drain line 23A, and a potential identical to that at the data line 22A is applied to the remaining drain lines 23B and so forth. In this situation, it can be judged whether the MFSFET 20A is loaded with information "1" or "0" depending upon if the potential at the data line 22A drops; since the MFSFET 20A is in its ON-state when the MFSFET 20A stores the information "1", the potential at the data line 22A drops. Meanwhile, since the MFSFET 20A is in its OFF-state when the MFSFET 20A stores the information "0", the potential at the data line 22A never drops.

In the case where the memory cell A stores the information "0" while the remaining memory cells B, C and D respectively store the information "1", i.e., the MFSFET 20A is in its OFF-state while the remaining MFSFETs 20B, 20C and 20D, are in ON-state, the potential at the data line 22A drops regardless of the memory cell A loaded with the information "0". This is because, in such a condition, the data line 22A is electrically connected through a path P to the drain line 23A to which the ground potential is applied. Thus, the current supplied to the data line 22A flows as leakage current through the path P into the drain line 23A, and eventually, the potential at the data line 22A drops.

As has been described, there arises the problem that the arrangement shown in FIG. 7 is incomplete to assuredly perform the reading operation.

SUMMARY OF THE INVENTION

A general object of the present invention is to overcome the above-mentioned technical disadvantage and provide a nonvolatile memory device in which the reading of stored data can be assuredly performed.

Another object of the present invention is to provide a nonvolatile memory device which is advantageous in enhancement of the integration.

A nonvolatile memory device according to the present invention includes a field effect transistor used for storage having a ferroelectric gate film and a Schottky diode connected in serial to the field effect transistor. The field effect transistor used for storage, for example, turns on when a polarization in the ferroelectric gate film is in a first direction, while it turns off when the polarization is in a second direction reverse to the first direction.

The reading is performed in the manner as follows. Information stored is identified by examining if the field effect transistor used for storage turns on in applying reading voltage at a specified level which allows the Schottky diode to turn on to a serial circuit consisting of the field effect transistor and the Schottky diode.

Even if the voltage is applied to the serial circuit when the reading is undesired, the voltage is interrupted by the Schottky diode, and therefore, no undesirable reading of information is performed. As previously mentioned, with a single field effect transistor, information can be stored, and moreover, such information can be read assuredly. Hence, the present invention advantageously brings about an enhanced integration of a nonvolatile memory device.

Such a field effect transistor used for storage is, for example, obtained by forming a source impurity region and a drain impurity region at a certain interval in a semiconductor substrate, defining a channel region therebetween, and providing a gate electrode above the channel region with a ferroelectric gate film sandwiched therebetween. In such a case, a Schottky diode can be formed by Schottky contact between either the source or drain impurity region in the field effect transistor and barrier metal, for example.

Employing the above-mentioned technique, impurity regions acting as source and drain regions can be formed shallower, compared with a case where a PN junction diode is formed in an impurity region. This is helpful for enhancing integration of a device.

These and other objects, features, advantages and effects of the present invention will become more fully apparent from the following detailed description of the preferred embodiments when taken in conjunction with the accompanying drawings.

DESCRIPTION OF THE PREFERRED EMBODIMENTS

Figure 1:
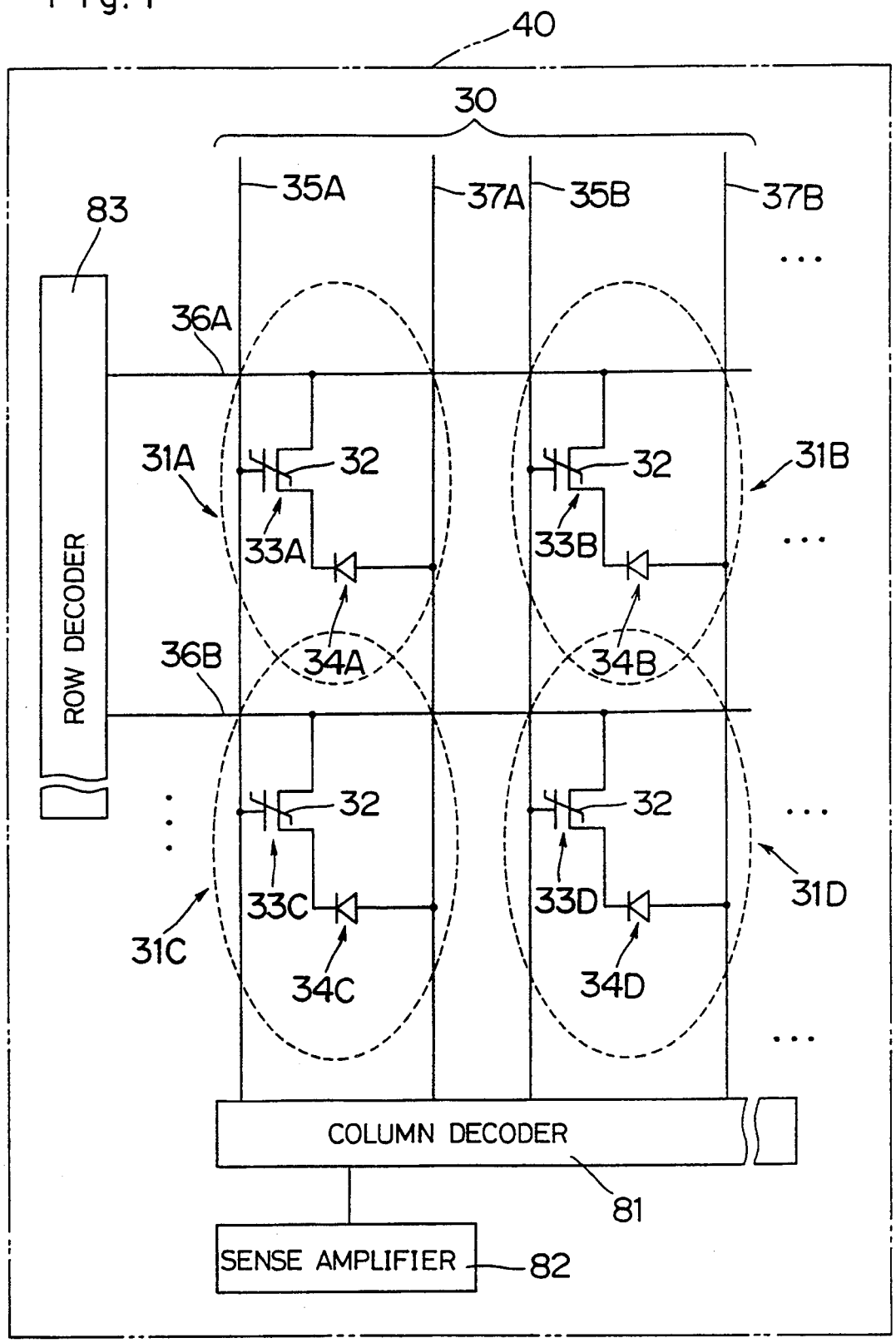
FIG. 1 is a circuit diagram showing an arrangement of a nonvolatile memory device of a first preferred embodiment according to the present invention.

FIG. 1 depicts electric circuitry in a nonvolatile memory device of a preferred embodiment according to the present invention. The nonvolatile memory device includes a memory cell array 30 disposed on a semiconductor substrate 40. The memory cell array 30 includes a plurality of nonvolatile memory cells 31A, 31B, 31C, 31D and so forth, arranged in a matrix manner on the semiconductor substrate 40. The nonvolatile memory cells 31A, 31B, 31C, 31D and so forth, are referred to as "nonvolatile memory cell(s) 31" en bloc hereinafter.

Referring to FIG. 1, there exist only four of the nonvolatile memory cells 31 although there are, in practice, arranged approximately 4096 of the nonvolatile memory cells 31 on the semiconductor substrate 40.

The nonvolatile memory cells 31A, 31B, 31C, 31D and so forth, are comprised of their respective field effect transistors 33A, 33B, 33C, 33D and so forth (referred to as "MFSFET"—Metal Ferroelectric Semiconductor Field Effect Transistor hereinafter) having a ferroelectric gate film 32, and respective Schottky diodes 34A, 34B, 34C, 34D and so forth, each of the MFSFETs being connected in series to the corresponding one of the Schottky diodes. Hereinafter, the MFSFETs 33A, 33B, 33C, 33D and so forth, are referred to as "MFSFET(s) 33" en bloc while the Schottky diodes 34A, 34B, 34C, 34D and so forth, are referred to as "Schottky diode(s) 34" en bloc.

The MFSFETs 33 utilize a residual polarization, which is a characteristic of ferroelectrics, to store information in a nonvolatile manner. Two sorts of information can be stored in a nonvolatile manner by varying a state of a polarization in the ferroelectric gate film 32. With the MFSFETs 33 of N channel type, for example, each of the MFSFETs 33 turns on if the ferroelectric gate film 32 is polarized with its part close to a gate electrode being of negative polarity. Meanwhile, the MFSFET 33 turns off if the ferroelectric gate film 32 is polarized with its part close to the gate electrode being of positive polarity. An ON-state of the MFSFET 33 corresponds to a condition where information "1" is stored while an OFF-state of the MFSFET 33 corresponds to a condition where information "0" is stored. The relations of ON/OFF of the MFSFET 33 to the stored information "1"/"0" may be reversed.

The MFSFETs 33 in the memory cells 31 aligned in one direction have their respective gates connected to a common word line such as word lines 35A, 35B and so forth. The MFSFETs 33 in the memory cells 31 aligned in a direction orthogonal to the word lines 35A, 35B and so forth, have their respective drains connected to a common data line such as 36A, 36B and so forth. The MFSFETs 33 in the memory cells 31 aligned along the word line such as word lines 35A, 35B and so forth, have their respective sources connected via the Schottky diodes 34 to the source line such as word lines 37A, 37B and so forth, where the Schottky diodes have their cathodes connected to the sources of the MFSFETs 33 and their anodes connected to the source line such as word lines 37A, 37B and so forth.

The word lines 35A, 35B and so forth, and the source lines 37A, 37B and so forth, are connected to a column decoder 81, and in writing, reading or erasing information, appropriate voltage is applied by the column decoder 81. The column decoder 81 is connected to a sense amplifier 82 to which it, in reading information, inputs a potential at the source line 37 connected to the specified memory cell 31 from which information is to be read. The sense amplifier 82 amplifies the received potential to produce a signal corresponding to the data stored in the memory cell 31 from which information is to be read.

On the other hand, the data lines 36A, 36B and so forth, are connected to a row decoder 83 which applies appropriate voltage to each of the data lines 36A, 36B and so forth, in writing, reading or erasing information.

The writing, reading and erasing in or from the nonvolatile memory will be described below. For convenience, it is now assumed that the memory cell 31A is selected as a sample.

<Writing>

In writing information, the column decoder 81 applies voltage $V_{pp}$ (e.g., 20 V) sufficient to polarize the ferroelectric gate film 32 of each MFSFET 33 to the word line 35A to which the memory cell 31 is connected and it also applies voltage of $V_{pp}/2$ to the remaining word lines 35B and so forth. The value $V_{pp}/2$ is, however, less than the coercive voltage. The column decoder 81 further applies the ground potential to the source lines 37A, 37B and so forth. The row decoder 83 applies the ground potential to the data line 36A to which the memory cell 31A is connected and it also applies programming inhibiting voltage $V_i$ ($\approx V_{pp}/2$, e.g., 10 V) to the remaining data lines 36B and so forth.

In the memory cell 31A in this situation, the programming voltage $V_{pp}$ is applied between the gate and drain of the MFSFET 33A. This causes a sufficient electric field to be applied to the ferroelectric gate film 32 in a direction from the gate electrode towards the semiconductor substrate 40, and the ferroelectric gate film 32 is polarized along the direction of the electric field. Consequently, the MFSFET 33A turns on, and the writing of information "1" is attained.

In the memory cell 31B, however, the voltage $V_{pp}/2$ lower than the coercive voltage is applied to the gate of the MFSFET 33B, and the ground potential is applied to its drain. Thus, there is no change in the direction of the polarization in the ferroelectric gate film 32, and this means there is no change in information stored in the memory cell 31B.

In the memory cell 31C, the programming voltage $V_{pp}$ is applied to the gate of the MFSFET 33C while the programming inhibiting voltage $V_i$ is applied to its drain. This causes merely an electric field corresponding to ($V_{pp}-V_i$) to be applied to the ferroelectric gate film 32. Thus, there is no change in information stored in the memory cell 31C.

In the memory cell 31D, the voltage $V_{pp}/2$ is applied to the gate of the MFSFET 33D while the programming inhibiting voltage $V_i$ is applied to its drain. Thus, the polarization in the ferroelectric gate film 32 of the MFSFET 33D is not changed, and eventually, information stored in the memory cell 31D remains unchanged.

<Reading>

In reading information, the column decoder 81 applies voltage SA lower than the coercive voltage to the source line 37A to which the memory cell 31A is connected, so as to supply current. The ground potential is applied to the remaining source lines 37B and so forth. The row decoder 83 applies the ground potential to the data line 36A to which the memory cell 31A is connected and it also applies the voltage SA identical to that which is applied to the source line 37A, to the data lines 36B and so forth, to which the memory cell 31A is not connected. Moreover, the column decoder 81 forces the word liens 35A, 35B and so forth, to be in a floating state. The column decoder 81 further applies to the sense amplifier 82 the potential at the source line 37A connected to the memory cell 31A.

If the memory cell 31A is loaded with the information "1", the MFSFET 33A is in its ON-state. Thus, the potential at the source line 37A drops down from SA to the ground potential. If the memory cell 31A is loaded with the information "0", the MFSFET 33A is in its OFF-state. Thus, the potential at the source line 37A never drops. Eventually, an output signal from the sense amplifier 82 which amplifies and outputs a potential at the source line 37A corresponds to the information stored in the memory cell 31A.

As previously mentioned, the Schottky diodes 34 are positioned between the sources of the MFSFETs 33 and the source lines 37A, 37B. When the voltages as states above are applied to the data lines 36A, 36B and so forth, and the source lines 37A, 37B and so forth, forward voltage sufficient to turn on the Schottky diodes 34B, 34C, 34D and so forth, is not applied to them in the memory cells 31B, 31C, 31D and so forth, other than the memory cell 31A. Thus, since the Schottky diodes 34B, 34C, 34D and so forth, interrupt leak current, information stored in the memory cells 31B, 31C, 31D and so forth, are never erroneously read.

<Erasing>

The erasing of information is executed for all the memory cells in each word line together. For example, the column decoder 81 applies erasing voltage $-V_{pp}$ different in polarity from the voltage used in the writing to the word line 35A to which the memory cell 31A is connected, and it also applies the ground potential to the remaining word lines 35B and so forth. Furthermore, the column decoder 81 applies the ground potential to all the source lines 37A, 37B and so forth. The row decoder 83 applies the ground potential to all the data lines 36A, 36B and so forth. In this way, information stored in all the memory cells 31A, 31C and so forth, connected to the word line 35A are erased.

Figure 2:
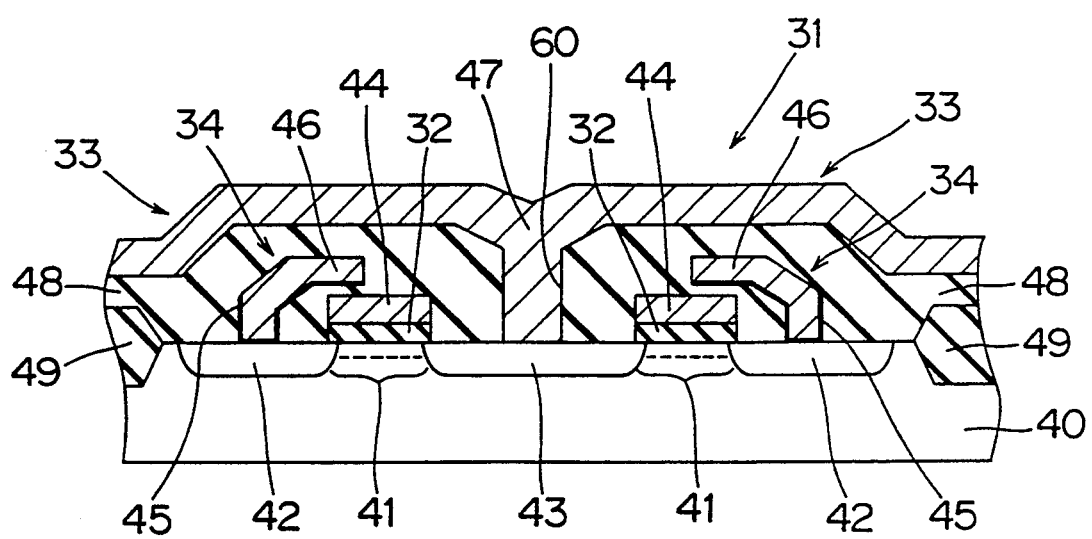
FIG. 2 is a partial sectional view showing the nonvolatile memory device.

FIG. 2 is a sectional view of the nonvolatile memory cell 31. In the P-type semiconductor substrate 40, an N+-type source region 42 and an N+-type drain region 43 are formed with a channel region 41 interposed between them. On the channel region 41, a gate electrode 44 is provided with the ferroelectric gate film 32 interposed therebetween. The foregoing is a configuration of the MFSFET 33. A barrier metal 45 is in Schottky contact with the source region 42 of the MFSFET 33. Each of the Schottky diodes is configured in this manner.

Reference numerals 46, 47, 48 and 49 denote a source wiring layer, a drain electrode wiring layer, a layer insulating film, and a field oxide film, respectively. The source wiring layer 46 is formed on the barrier metal 45. The drain electrode wiring layer 47 is formed on the layer insulating film 48 and comes in contact with the drain region 43 in a contact hole 60.

It also is possible to fabricate a PN junction diode by further diffusing P-type impurity within the N+-type source region 42. Employing such a design, however, a diffusion layer for a source region must be made deeper, and this prevents an enhancement of the integration of the device. The reason is that, making the diffusion layer for the source region insufficient in depth might cause the PN junction within the source region to electrically connect with the semiconductor substrate or a well.

In the nonvolatile memory cell according to the present invention, however, the Schottky diode 34 is configured in such a manner that the barrier metal 45 is in contact with the source region 42 of the MFSFET 33, and therefore, the depth of the impurity diffused layer for the source and drain regions 42, 43 can be reduced. Thus, the integration of the nonvolatile memory device can be effectively performed.

Figure 3A:
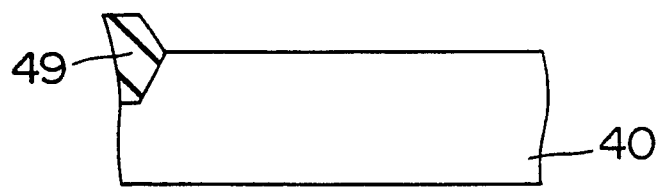
FIGS. 3A to 3K are sectional views illustrating steps of manufacturing the nonvolatile memory device in order.

A method of manufacturing the nonvolatile memory cell will now be described with reference to FIGS. 3A to 3K. FIGS. 3A to 3K are sectional views illustrating steps of the nonvolatile memory cell manufacturing method in the process order. First, as shown in FIG. 3A, a field oxide film 49 is formed on the P-type semiconductor substrate 40.

Figure 3B:
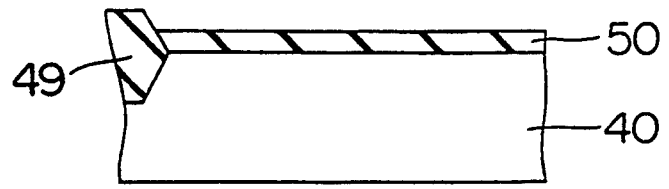

Then, after ferroelectrics 50 such as PbTiO$_3$ and the like is deposited on the semiconductor substrate 40 by means of high frequency spattering as shown in FIG. 3B, a thermal treatment is carried out for several hours. The high frequency spattering may be performed under the following conditions, for example: A radius of a target is 80 nm; a pace of a target substrate is 35 nm; target RP voltage is 1.6 kV; spattering power is 150 W; spattering gas is a mixed gas of Ar and O$_2$ mixed at the rate of 9: 1; gas pressure is $2 \times 10^{-2}$ Torr; temperature of the substrate is 400° to 500° C.; and a spattering ratio is 3 nm/minute. At the same time, the target must get compensation of lead (of 10 Wt. % and calcined). As to the temperature of the substrate, it may be retained at 400° C. during the spattering and then at 500° C. during the thermal treatment thereafter.

Figure 3C:
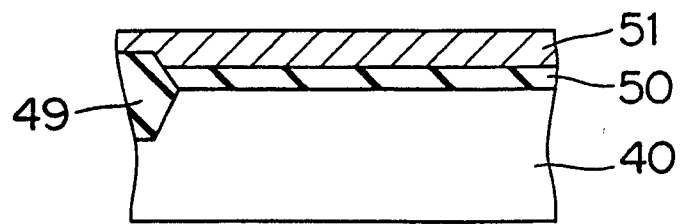

Furthermore, as shown in FIG. 3C, electrode substance 51 such as platinum is deposited on the ferroelectrics 50 by means of spattering.

Figure 3D:
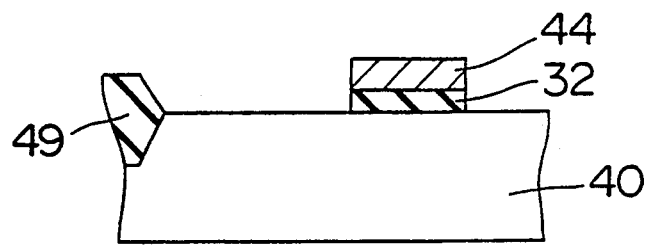

After that, as shown in FIG. 3D, the ferroelectrics 50 and the electrode substance 51 are removed by etching with a mask of resist to form the ferroelectric gate film 32 and the gate electrode 44 for the MFSFET 33 on the semiconductor substrate 40.

Figure 3E:
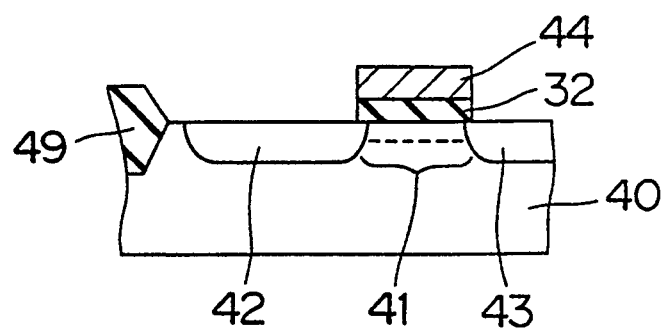

Then, as shown in FIG. 3E, N-type impurity is injected at high concentration into the semiconductor substrate 40, utilizing a self-alignment technique, to form the source region 42 and the drain region 43 in and around the surface of the semiconductor substrate 40. The source region 42 and the drain region 43 together define the channel region 41 therebetween.

Figure 3F:
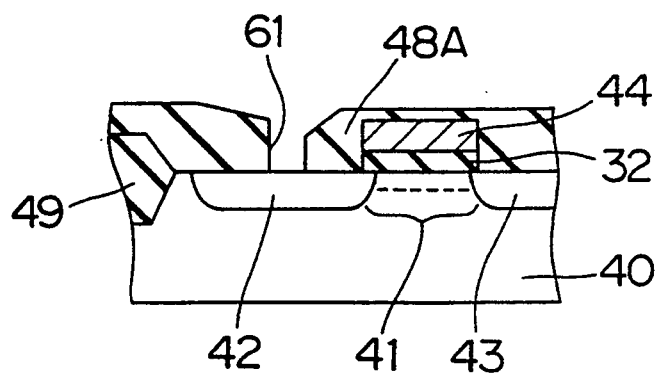

Moreover, as shown in FIG. 3F, a layer insulating film 48A is deposited, and thereafter, a contact hole 61 is formed by etching so that the source region 42 is exposed.

Figure 3G:
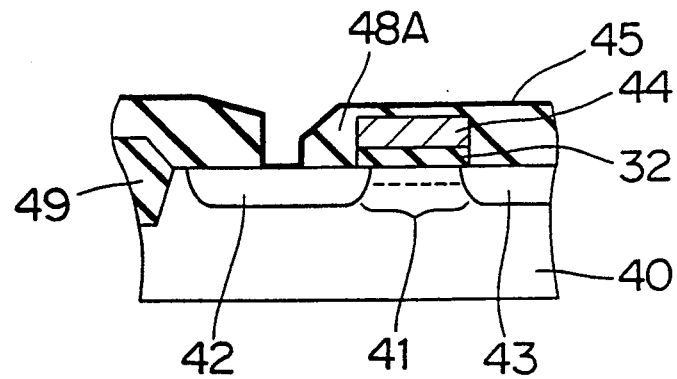

Then, as shown in FIG. 3G, the barrier metal 45 having a high fusing point (e.g., platinum) is superposed by means of vapor deposition so as to be in contact with the source region 42 exposed at the step shown in FIG. 3F. After that, the substrate is annealed in the nitrogen containing ambience at such a low temperature that the junction between the source region 42 and the barrier metal 45 may not make an ohmic contact (e.g., in the vicinity of 600° C.) to form the Schottky diode 34. A thickness of the barrier metal 45 is preferably, for example, 50 to 100 nm.

Figure 3H:
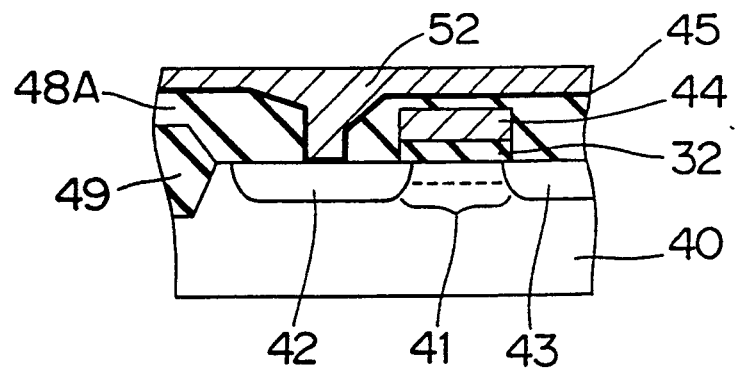

After that, as shown in FIG. 3H, wiring material 52 such as aluminum is deposited on the barrier metal 45 by means of spattering.

Figure 3I:
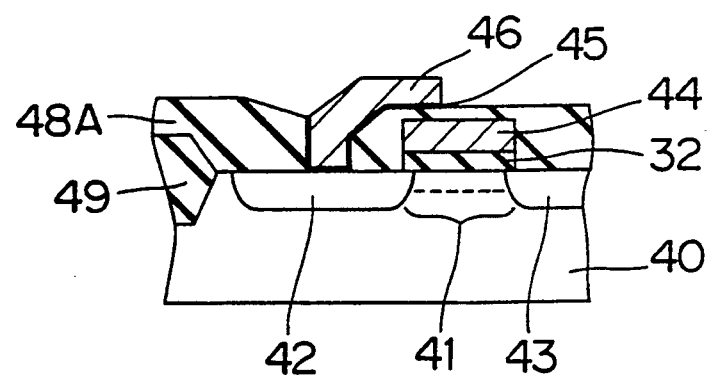

Then, as shown in FIG. 3I, the wiring material 52 is patterned to form the source wiring layer 46. Simultaneously, the barrier metal 45 is partially removed together with the wiring material 52.

Figure 3J:
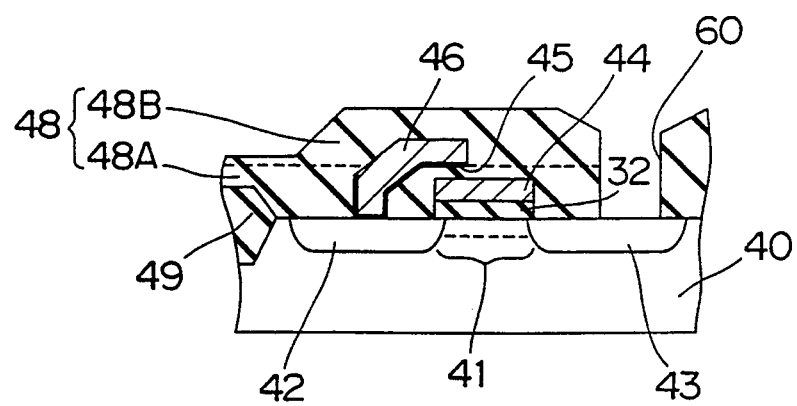

Furthermore, as shown in FIG. 3J, a layer insulating film 48B is laminated on the layer insulating film 48A, and thereafter, the contact hole 60 is formed by etching so that the drain region 43 is exposed.

Figure 3K:
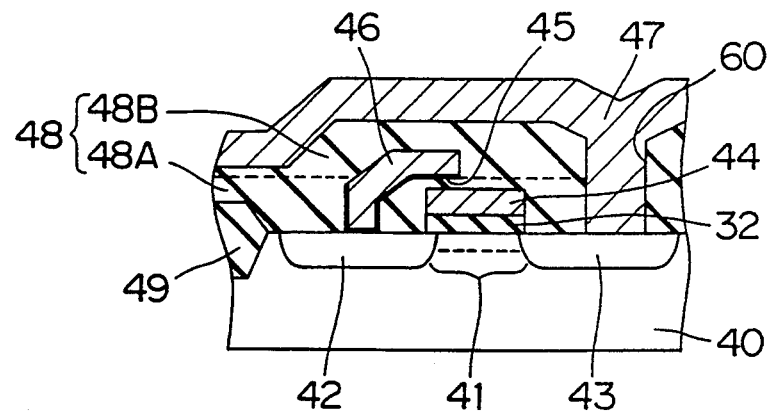
Figure 4:
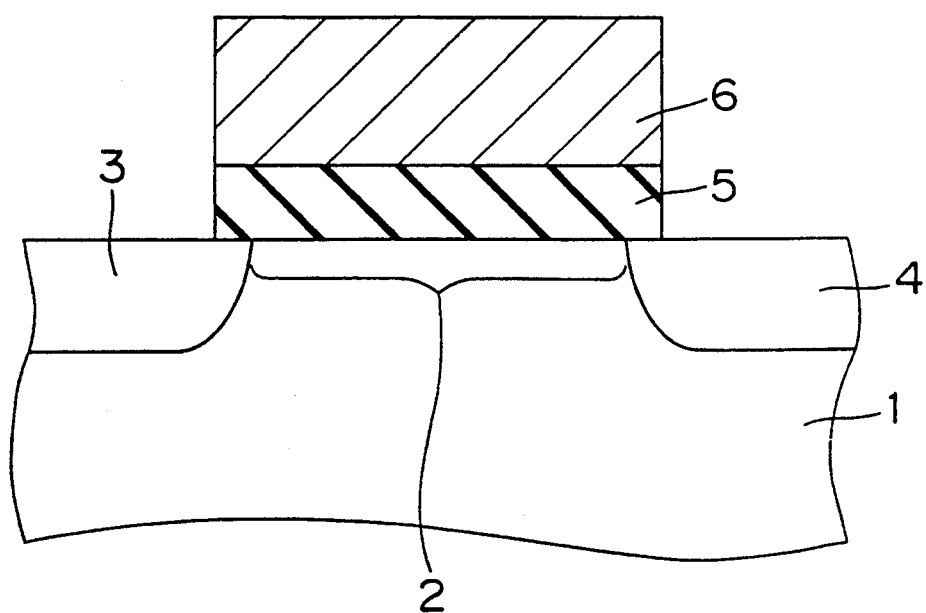
FIG. 4 is a sectional view of a MFSFET.
Figure 5:
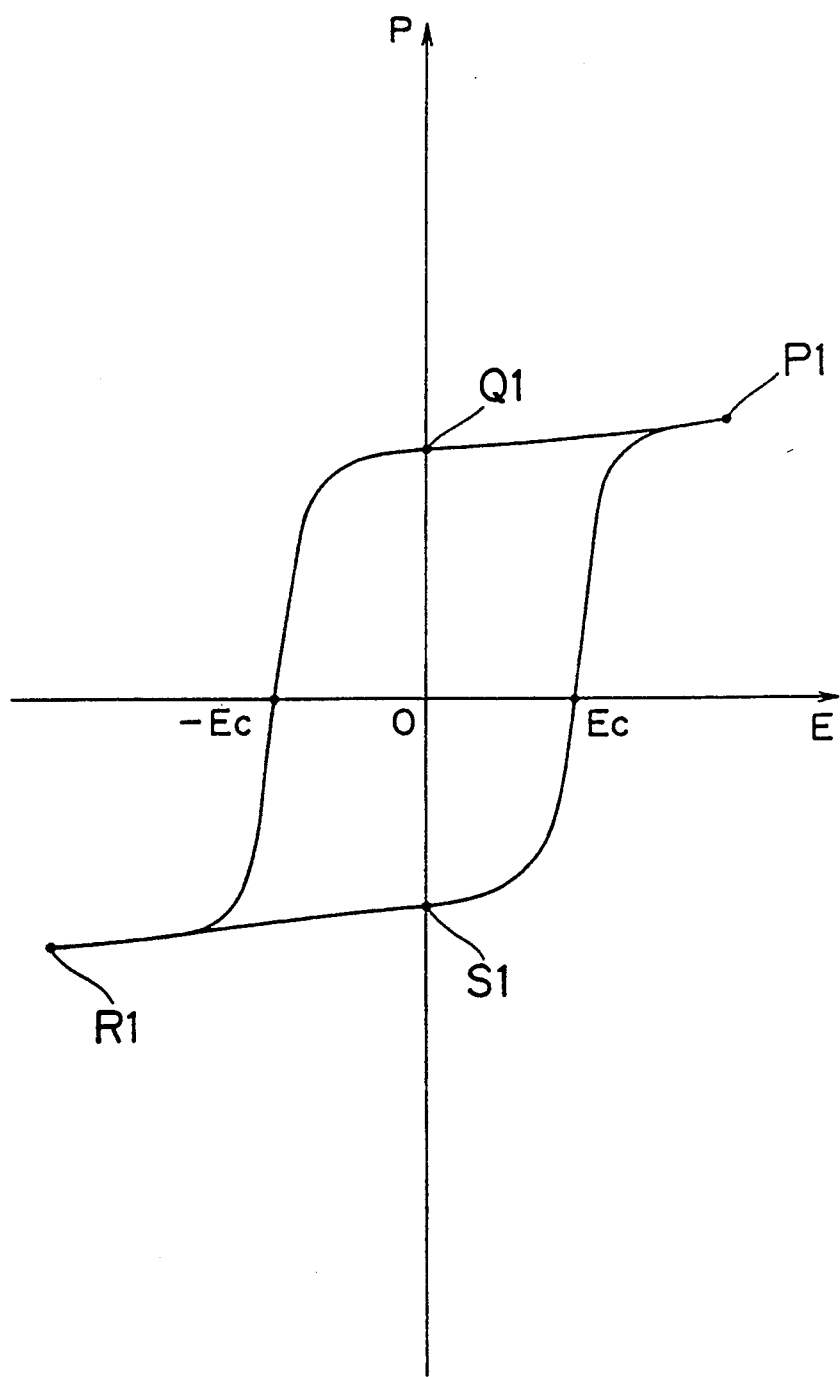
FIG. 5 is a graph representing a hysteresis characteristic of a polarization in ferroelectrics related to an electric field.
Figure 6A:
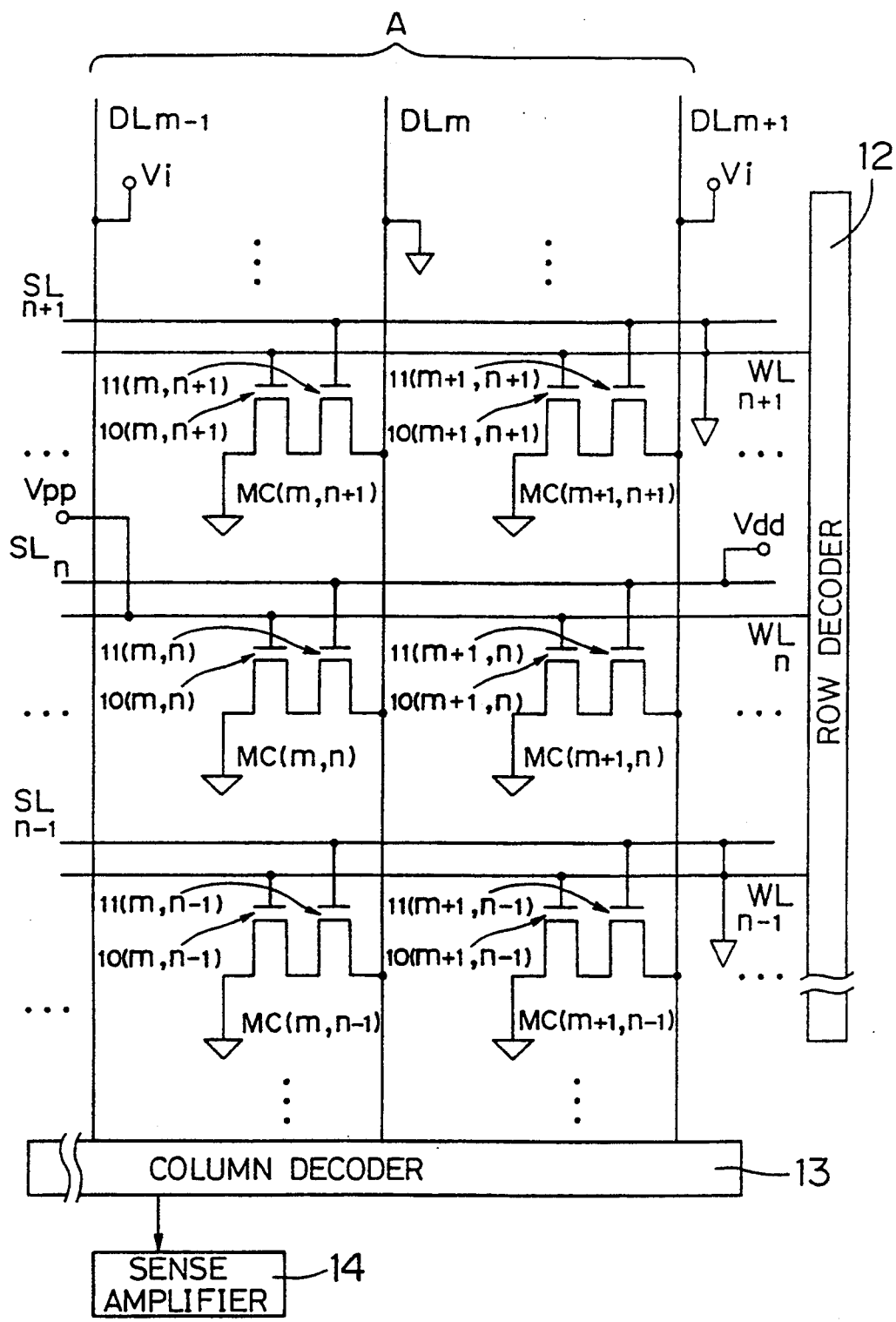
FIGS. 6A to 6C are circuit diagrams helpful to explain the operation of the nonvolatile memory device where the MFSFET shown in FIG. 4 is utilized.
Figure 6B:
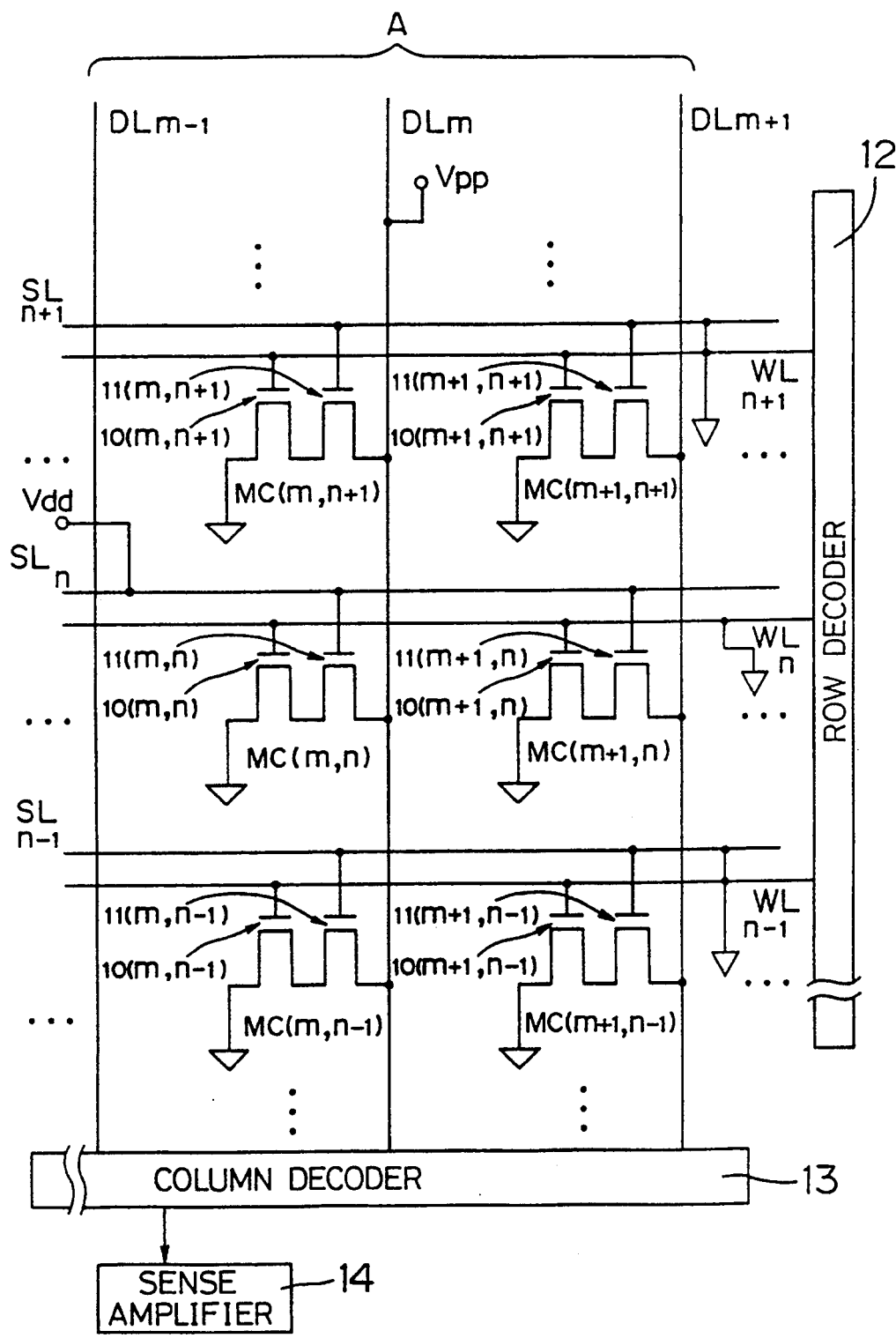
Figure 6C:
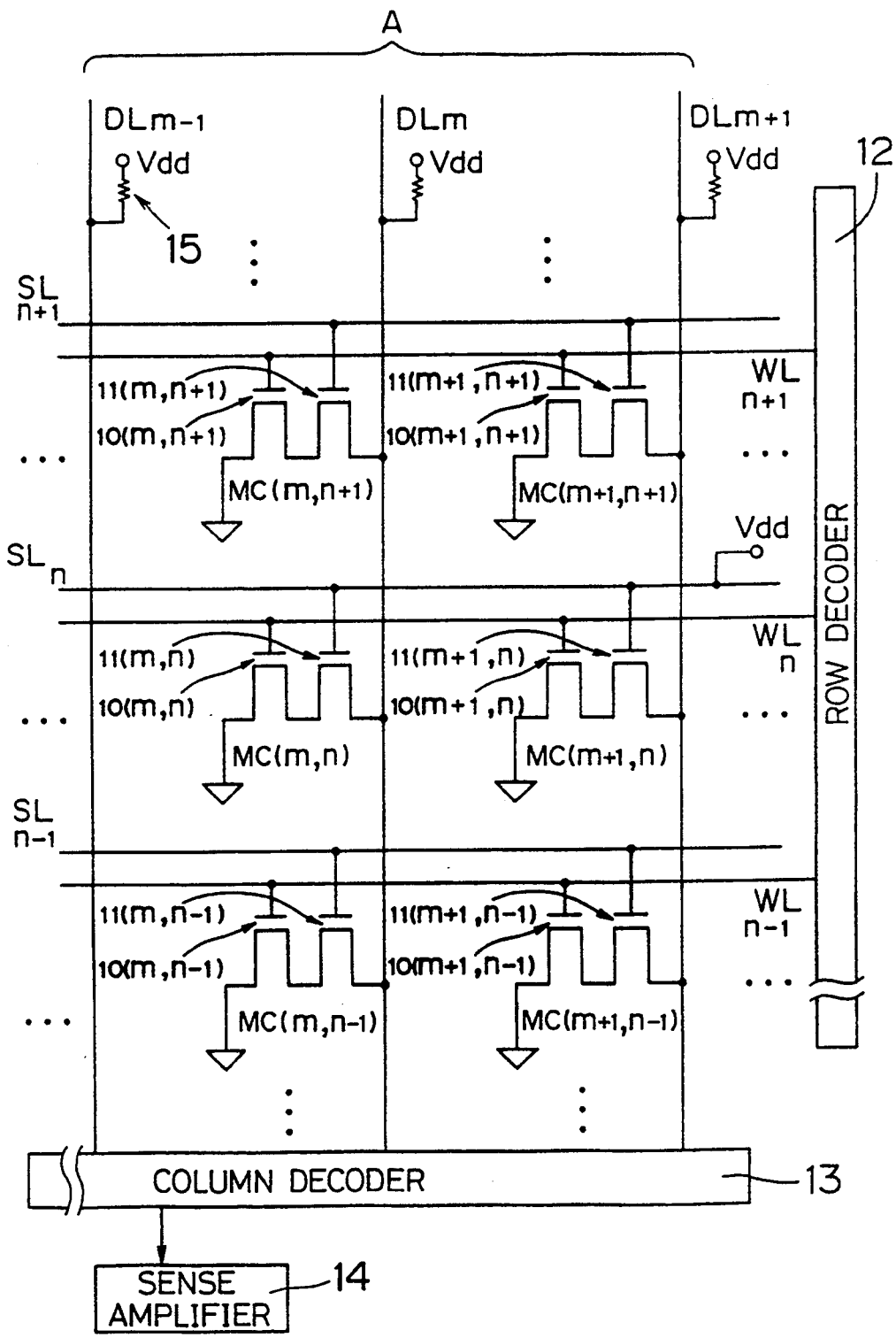
Figure 7:
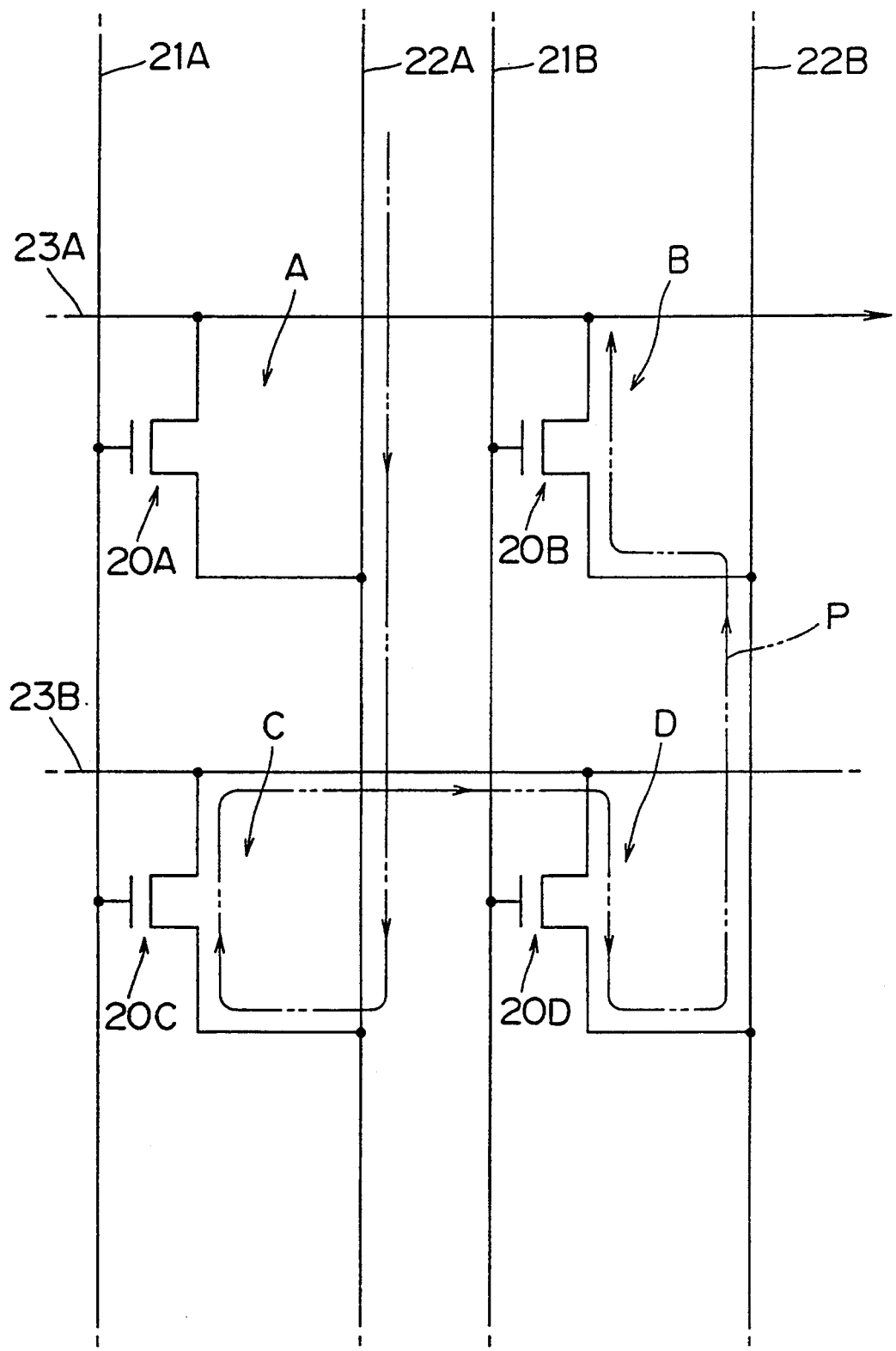
FIG. 7 is a circuit diagram showing a nonvolatile memory device having a configuration where a single cell has a single transistor.

Finally, as shown in FIG. 3K, the drain electrode wiring layer 47 is formed in contact with the drain region 43 exposed at the step shown in FIG. 3J. In this way, the nonvolatile memory cell configured as shown in FIG. 2 can be obtained.

In the method as mentioned above, the temperature in annealing the barrier metal 45 is set low to make as less ohmic contact between the barrier metal 45 and the source region 42 as possible, so that the barrier metal 45 can come into Schottky contact with the source region 42. Thus, a Schottky diode can be formed simultaneous with a formation of the barrier metal 45, and hence, a manufacturing process can be simplified.

If the barrier metal 45 for the Schottky diode and the source wiring layer 46 are made of the same material, the Schottky diode 34 and the source wiring layer 46 can be formed simultaneously, and therefore, the manufacturing process can be further simplified.

While what are currently deemed preferred embodiments of the present invention have been described, it is not intended that the present invention be limited to those embodiments. In the above embodiments, for example, N channel MFSFETs are used to constitute the nonvolatile memory cell though P channel MFSFETs may be used instead. Also in the above embodiments, Schottky diodes are positioned between the MFSFETs and the source lines though they may be placed between the data lines and the MFSFETs.

Although the preferred embodiments of the present invention have been described in detail, it should be understood that the foregoing is by way of example only to set forth the technical subjects of the present invention and that the present invention not be taken by way of limitation to the examples defined by the foregoing. The true spirit and scope of the present invention should be defined only by the description of the appended claims.

What is claimed is:

1. A nonvolatile memory device comprising
a field effect transistor for storing, information having (i) a pair of impurity regions formed at a certain interval in a semiconductor substrate, (ii) a channel region between the pair of the impurity regions, (iii) a ferroelectric gate film formed on the channel region, and (iv) a gate electrode formed on the ferroelectric gate film; and
a Schottky diode which has barrier metal formed so as to come into contact with one of said pair of impurity regions and is connected in series to said field effect transistor.

2. A nonvolatile memory device according to claim 1, further comprising
information writing means, applying an electric field to said ferroelectric gate film to polarize said ferroelectric gate film in a first specified direction, for writing information in said field effect transistor;
information reading means, applying voltage to a serial circuit comprised of said field effect transistor and said Schottky diode to turn the Schottky diode on and detecting if said pair of impurity regions are electrically connected or not, for reading information from said field effect transistor; and
information erasing means, applying an electric field to said ferroelectric gate film to polarize said ferroelectric gate film in a second direction reverse to said first direction, for erasing information from said field effect transistor.

3. A nonvolatile memory device comprising
a plurality of memory cells arranged in a matrix manner on a semiconductor substrate, each of which includes (a) a field effect transistor for storing information having (i) a pair of impurity regions formed at a certain interval in the semiconductor substrate, (ii) a channel region between the pair of the impurity regions, (iii) a ferroelectric gate film formed on the channel region, and (iv) a gate electrode formed on the ferroelectric gate film, and (b) a Schottky diode which has barrier metal formed so as to come into contact with one of said pair of the impurity regions and is connected in series to said field effect transistor;

word lines each of which is connected to the gate electrode of said field effect transistor of each of the memory cells aligned in a specified direction;

data lines each of which is connected to a serial circuit comprised of said Schottky diode and said field effect transistor of each of the memory cells aligned in a direction orthogonal to the word lines on an end close to said field effect transistor;

source lines each of which is connected to the serial circuit comprised of said Schottky diode and said field effect transistor of each of the memory cells aligned in a specified direction on an end close to said Schottky diode;

means for selecting any one of the memory cells;

information writing means, applying writing voltage to said word line connected to selected one of the memory cells to polarize said ferroelectric gate film of said field effect transistor in the selected memory cell in a first specified direction, for writing information in the selected memory cell;

information reading means, applying voltage between the data line connected to the selected one of the memory cells and the source line connected to the selected memory cell to turn said Schottky diode on and simultaneously detecting if said pair of the impurity regions are electrically connected or not, for reading information from the selected memory cell; and information erasing means, applying an electric field to said ferroelectric gate film of said field effect transistor in the selected one of the memory cells to polarize the ferroelectric gate film in a second direction reverse to said first direction, for erasing information from the selected memory cell.

4. A nonvolatile memory device according to claim 3, further comprising means for applying voltage which is lower in absolute value than voltage inverting a direction of a polarization in said ferroelectric gate film of said field effect transistor and which is identical in polarity to said writing voltage to all the word lines but the word line connected to selected one of the memory cells in writing information in the selected memory cell; and means applying writing inhibiting voltage approximate in level to said writing voltage to all the data lines but the data line connected to the selected one of the memory cells in writing information in the selected memory cell, for preventing an inversion of the polarization in said ferroelectric gate film of said field effect transistor in each of the memory cells not selected.

5. A nonvolatile memory device according to claim 3, wherein said information reading means includes means for applying voltage to said source line to turn said Schottky diode on, and a means for detecting variations in potential at said source line.

6. A nonvolatile memory device according to claim 3, wherein said information erasing means includes means for applying erasing voltage reverse in polarity to said writing voltage to the said word line connected to selected one of the memory cells in erasing information from the selected memory cell to polarize said ferroelectric gate film of said field effect transistor in the selected memory cell in said second direction.

7. A nonvolatile memory device according to claim 6, wherein said information erasing means erases information from all the memory cells commonly connected to each word line en bloc.

8. A nonvolatile memory device according to claim 3, wherein said information reading means applies voltage between the data line connected to the selected memory cell and the source line connected to the selected memory cell to turn on the Schottky diode of only the selected memory cell and simultaneously detects whether or not the pair of impurity regions of the transistor of the selected memory cell are electrically connected, thereby to read information only from the selected memory cell.

9. A nonvolatile memory device, comprising:

a field effect transistor for storing information, the transistor including:
  a semiconductor substrate having a pair of spaced apart impurity regions and a channel region between the impurity regions,
  a ferroelectric gate film formed on the channel region, and
  a gate electrode formed on the ferroelectric gate film;

information writing means, applying an electric field to the ferroelectric gate film to polarize the ferroelectric gate film in a first specified direction, for writing information in the transistor;

information erasing means, applying an electric field to the ferroelectric gate film to polarize the ferroelectric gate film in a second direction reverse to the first direction, for erasing information from the transistor; and selectively reading means, for selectively reading the information from the transistor, the selectively reading means including a Schottky diode having a barrier metal formed so as to contact one of the pair of impurity regions and connected in series to the field effect transistor, means for selectively applying voltage to a serial circuit comprised of the transistor and the Schottky diode to turn the Schottky diode on, and means for detecting whether the pair of impurity regions are electrically connected only when the Schottky diode is turned on.

10. A nonvolatile memory device, comprising:

(a) an array of memory cells arranged in rows and columns in a matrix manner on a semiconductor substrate, each memory cell including
  (1) a field effect transistor for storing binary information, the transistor having:
    (i) a semiconductor substrate having first and second spaced apart impurity regions and a channel region between the impurity regions, the stored binary information corresponding to whether or not the impurity regions are electrically connected across the channel region,
    (ii) a ferroelectric gate film formed on the channel region, and
    (iii) a gate electrode formed on the ferroelectric gate film, and
  (2) a Schottky diode having barrier metal formed so as to contact the first impurity region, the Schottky diode connected in series to the transistor to form a series circuit therewith;

(b) word lines connected to the gate electrodes of the transistors of the respective columns of memory cells;

(c) data lines connected to the second impurity regions of the transistors of the respective rows of memory cells;

(d) source lines connected to the series circuits of the respective columns of memory cells at ends of the series circuits closest to the Schottky diodes thereof;

(e) means for selecting any one of the memory cells of the array;

(f) information writing means, applying a writing voltage to the word line connected to the selected memory cell so as to polarize the ferroelectric gate film of the transistor thereof in a first specified direction, for writing information in the selected memory cell;

(g) information erasing means for applying an electric field to the ferroelectric gate film of the transistor of the selected memory cell to polarize the ferroelectric gate film in a second specified direction reverse to the first specified direction, so as to erase information from the selected memory cell; and (h) information reading means, selectively applying voltages between the data lines and the source lines so that a voltage applied between the data line and source line connected to the selected memory cell turns on the Schottky diode of the selected memory cell, and voltages applied between the data lines connected to all of the memory cells of the array except the selected memory cell hold off the Schottky diodes of the memory cells of the array except the selected memory cell, and simultaneously detecting whether or not the first and second impurity regions of the transistor of the selected memory cell are electrically connected, for reading information only from the selected memory cell.

* * * * *